(12) United States Patent
Chen

(10) Patent No.: US 6,710,729 B1
(45) Date of Patent: Mar. 23, 2004

(54) IDLE CHANNEL TONE AND PERIODIC NOISE SUPPRESSION FOR SIGMA-DELTA MODULATOR USING FEEDBACK-QUANTIZER

(75) Inventor: Juinn-Yan Chen, Fremont, CA (US)

(73) Assignee: Faraday Technology Corp., Hsinchu (TW)

(*) Notice: Subject to any disclaimer, the term of this patent is extended or adjusted under 35 U.S.C. 154(b) by 0 days.

(21) Appl. No.: 10/267,843

(22) Filed: Oct. 10, 2002

(51) Int. Cl.[7] ................................. H03M 3/00
(52) U.S. Cl. .................. 341/143; 341/144; 341/131; 341/123
(58) Field of Search ................. 341/143, 110, 341/131, 144, 123, 155

(56) References Cited

U.S. PATENT DOCUMENTS

| | | | |
|---|---|---|---|
| 5,144,308 A | * 9/1992 | Norsworthy | 341/143 |
| 5,497,154 A | * 3/1996 | Komamura | 341/131 |
| 5,815,102 A | * 9/1998 | Melanson | 341/143 |
| 5,889,482 A | * 3/1999 | Zarubinsky et al. | 341/143 |
| 6,150,969 A | * 11/2000 | Melanson | 341/143 |

* cited by examiner

Primary Examiner—Michael Tokar
Assistant Examiner—Lam Mai
(74) Attorney, Agent, or Firm—Rabin & Berdo, P.C.

(57) ABSTRACT

A sigma-delta modulator. The sigma-delta modulator comprises an integrator, a first quantizer, a dither generator and an adding device. An input terminal of the first quantizer and an input terminal of the dither generator are coupled to an output terminal of the integrator. The first quantizer generates a first random signal. The dither generator comprises a second quantizer for generating a second random signal, an input terminal thereof coupling to the output of the integrator; a random sequencer for receiving the first random signal and the second random signal to produce a third random signal output; and an attenuator for attenuating the third random signal to produce a dither signal to output. The dither signal is added to an input terminal of the integrator by the adding device.

12 Claims, 9 Drawing Sheets

IDLE CHANNEL TONE AND PERIODIC NOISE SUPPRESSION FOR SIGMA-DELTA MODULATOR USING FEEDBACK-QUANTIZER

BACKGROUND OF THE INVENTION

1. Field of the Invention

The present invention relates in general to a sigma-delta modulator. In particular, the present invention relates to a sigma-delta modulator comprising a dither generator.

2. Description of the Related Art

Sigma-delta techniques (as part of the digital-to-analog or analog-to-digital conversion function) are finding wide acceptance in many applications such as telephone codecs, compact disc (CD) players and the like. Sigma-delta techniques are popular because of the tolerance of the techniques to circuit variations present in integrated circuit fabrication processes. Hence, a sixteen or more bit linear converter may be implemented relatively inexpensively in integrated form, compared to more conventional circuit techniques such as flash converters or subranging converters.

Sigma-delta converters are not without drawbacks, however, since high bit rate processing is required, pushing low power technologies (such as CMOS) to their limits, especially with wide bandwidth signals such as digital audio. In addition, sigma-delta converters suffer from periodic noise and spurious tone generation (in-band and out-of-band) due to the feedback required to implement the converter, discussed in more detail below. Although the periodic noise and spurious tones typically occur at very low levels (for example, about 90 dB below full scale), they may be very objectionable to a user while having virtually no impact on a data acquisition system using the same converter. The noise and tones are typically noticeable when no, or a very low, desired signal is present. The periodic noise and tones are generally referred to as idle channel noise.

Conventional techniques for removing periodic noise and tones generally attempt to "whiten" the periodic noise and tones from the converter, thereby suppressing them. These techniques include adding a small dither signal (noise) or an out-of-band tone (such as a 25 KHz sine wave, which is above the human ear's hearing frequency range) to the input to the Sigma-delta converter. Generally, the addition of the dither signal is not regarded as wholly effective since it adds noise to the output of the converter (which may raise the noise floor of the converter) while not entirely suppressing the periodic noise and spurious tones. While the out-of-band tone insertion may reduce the in-band spurious tones, the dynamic range of the converter suffers since the converter now has to process the desired signal and out-of-band tone without saturation.

U.S. Pat. No. 5,144,308, entitled "Idle Channel Tone and Periodic Noise Suppression for Sigma-Delta Modulators Using High-Level Dither," by Steven R. Norsworthy, issued Sep. 1, 1992, herein incorporated by reference, discloses a technique for using a digitally generated dither signal to improve the performance of a sigma-delta modulator by reducing the amount of periodic noise and spurious tones generated in the modulator output signal. However, employing a dither signal to improve the performance of a sigma-delta modulator in this respect may also reduce the dynamic range of the sigma-delta modulator. Thus, a need exists for a technique employing dither to reduce idle channel tones without substantially degrading or reducing the dynamic range of the sigma-delta modulator.

U.S. Pat. No. 5,745,061, entitled "Method of Improving the Stability of a Sigma-Delta Modulator Employing Dither," by Norsworthy et al., filed Jul. 28, 1995, herein incorporated by reference, discloses a technique of employing dither to reduce idle channel tones without substantially degrading or reducing the dynamic range of the sigma-delta modulator. Because, in U.S. Pat. No. 5,745,061, a pseudo-random sequencer is required and the mechanism is more complex than that disclosed in U.S. Pat. No. 5,144,308, the hardware cost of the mechanism is high. A need exists for a technique of employing dither to reduce idle channel tones without high hardware costs.

SUMMARY OF THE INVENTION

An object of the present invention is to provide a sigma-delta modulator to suppress idle channel tones without substantially degrading or reducing the dynamic range of the sigma-delta modulator.

Another object of the present invention is to provide a sigma-delta modulator, with simplified mechanism compared to the Prior Art, implemented to significantly decrease development and design costs.

In the invention, the sigma-delta modulator comprises an integrator, a first quantizer, a dither generator and an adding device. The integrator has an input terminal and an output terminal. A first random signal is generated by the first quantizer. An input terminal of the first quantizer is coupled to an output terminal of the integrator. An input terminal of the dither generator is coupled to an output terminal of the integrator. The dither generator comprises a second quantizer, a random sequencer and an attenuator. A second random signal is generated by the second quantizer. An input terminal of the second quantizer is coupled to the output of the integrator. The random sequencer receives the first random signal and the second random signal and produces a third random signal to be output. The third random signal is attenuated by the attenuator to produce a dither signal. The dither signal is output from the attenuator. The dither signal is added to the input terminal of the integrator by the adding device.

Furthermore, the invention provides another kind of dither generator. The dither generator comprises a single-bit quantizer and a random sequencer. A second random signal is generated by the single-bit quantizer. An input terminal of the single-bit quantizer is coupled to the output of the integrator. The random sequencer is a logic circuit digitally implementing XOR logic. The random sequencer receives the first random signal and the second random signal and produces a dither signal to be output. The dither signal is output from the random sequencer.

The invention provides another kind of dither generator. The dither generator comprises a comparator, a random sequencer, a single-bit digital-to-analog converter and an attenuator. A second random signal is generated by the comparator. An input terminal of the comparator is coupled to the output of the integrator. The random sequencer is a logic circuit digitally implementing XOR logic. The random sequencer receives the first random signal and the second random signal and produces a third random signal to be output. The third random signal is converted into an analog signal by the single-bit digital-to-analog converter. The analog signal is attenuated by the attenuator to produce a dither signal. The dither signal is output from the attenuator.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
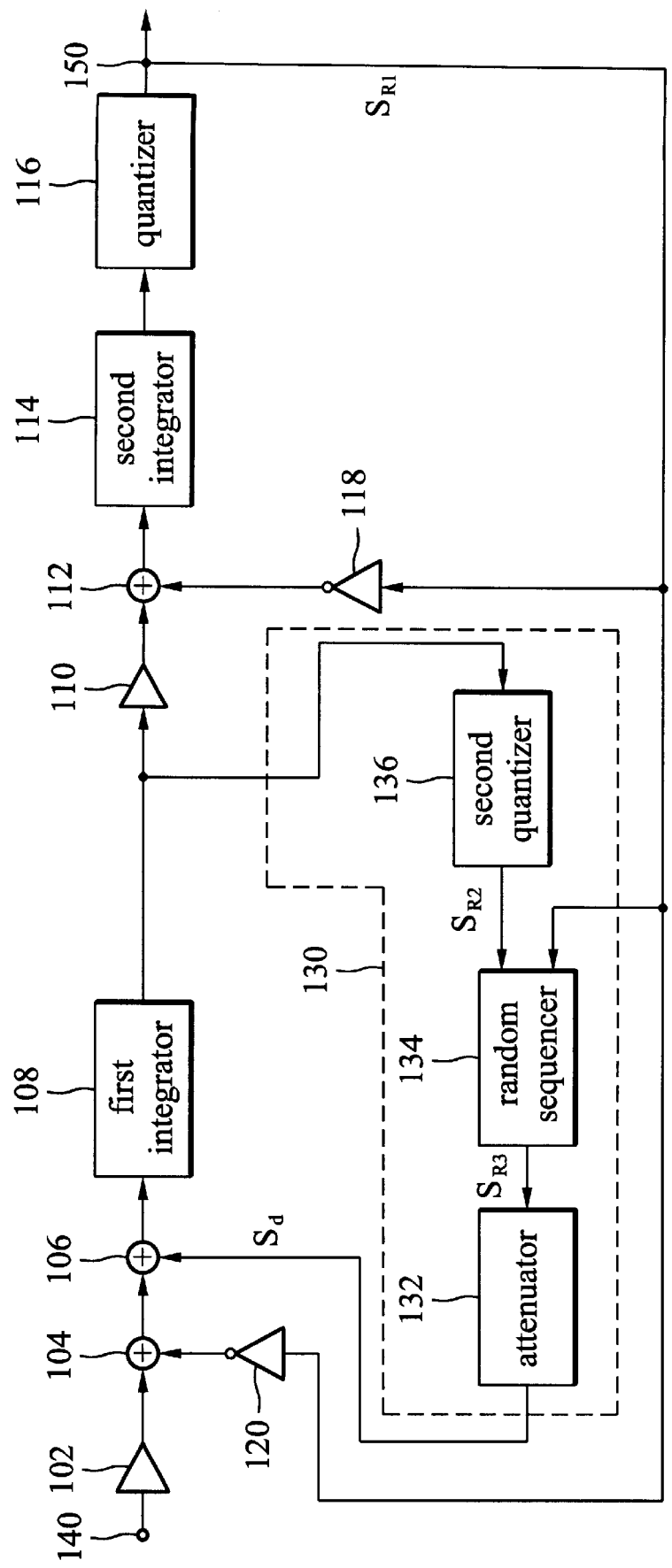
FIG. 1 is a schematic diagram illustrating a sigma-delta modulator according to the first embodiment of the invention.

FIG. 1 is a schematic diagram illustrating a sigma-delta modulator according to the first embodiment of the invention. The sigma-delta modulator includes an input signal port 140 and an output signal port 150. The sigma-delta modulator in the embodiment is a modulator having two integrators 108 and 114 between the input signal port 140 and a quantizer 116 therein. The number of integrators in the modulator is generally referred to as the order of the modulator.

The sigma-delta modulator includes a feedforward signal path, a first feedback signal path, a second feedback signal path, a third feedback signal path and a forth feedback signal path. The feedforward signal path comprises a first gain unit 102, a first adder 104, a second adder 106, the first integrator 108, a second gain unit 110, a third adder 112, the second integrator 114 and the quantizer 116. The first feedback signal path is from the output signal port 150 to the third adder 112 via a first inverting gain unit 118. The second feedback signal path is from the output signal port 150 to the second adder 106 via a dither generator 130. The third feedback signal path is from the output signal port 150 to the first adder 104 via a second inverting gain unit 120. The fourth feedback signal path is from an output terminal of the first integrator 108 to the second adder 106 via the dither generator 130. In addition, the first gain unit 102 has a first gain factor (not shown in FIG. 1). The second gain unit 110 has a second gain factor (not shown in FIG. 1). The first inverting gain unit 118 has a third gain factor (not shown in FIG. 1). The second inverting gain unit 120 has a forth gain factor (not shown in FIG. 1). The absolute values of the first gain factor, the second gain factor, the third gain factor and the fourth gain factor are smaller than 1.

The dither generator 130 comprises a second quantizer 136, a random sequencer 134 and an attenuator 132. The second quantizer 136 is coupled to the output terminal of the first integrator 108. A second random signal $S_{R2}$ is generated by the second quantizer 136. Then, the second random signal $S_{R2}$ is input to the random sequencer 134. A first random signal $S_{R1}$ is generated by the quantizer 116. Through the second feedback signal path, the first random signal $S_{R1}$ is input to the random sequencer 134. The random sequencer 134 is a logic circuit digitally implementing XOR logic. The random sequencer 134 receives the first random signal $S_{R1}$ and the second random signal $S_{R2}$ and produces a third random signal $S_{R3}$ to be output. The third random signal $S_{R3}$ is attenuated by the attenuator 132 to produce a dither signal $S_d$. The dither signal $S_d$ is output from the attenuator 132 and input to the second adder 106.

While FIG. 1 illustrates the embodiment on a 2-order modulator, the invention is not limited in scope in this, and can be applied to any order of modulator.

Figure 2:
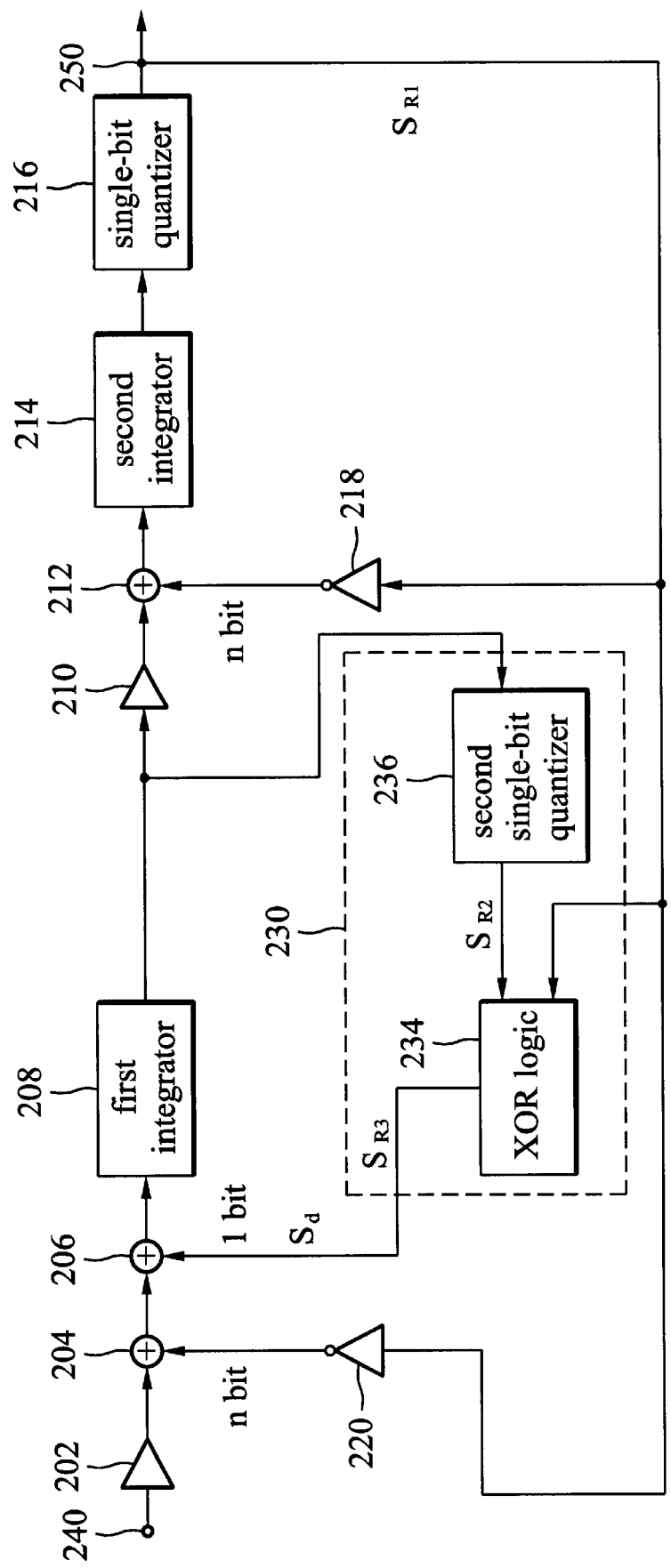
FIG. 2 is a schematic diagram illustrating a sigma-delta modulator according to the second embodiment of the invention.

FIG. 2 is a schematic diagram illustrating a sigma-delta modulator according to the second embodiment of the invention. The sigma-delta modulator is employed to perform digital-to-analog conversion, and includes an input signal port 240 and an output signal port 250. A digital signal is input to the input signal port 240. The sigma-delta modulator in the embodiment is a modulator having two integrators 208 and 214 between the input signal port 240 and a single-bit quantizer 216 therein. The number of integrators in the modulator is generally referred to as the order of the modulator.

The sigma-delta modulator includes a feedforward signal path, a first feedback signal path, a second feedback signal path, a third feedback signal path and a forth feedback signal path. The feedforward signal path comprises a first gain unit 202, a first adder 204, a second adder 206, the first integrator 208, a second gain unit 210, a third adder 212, the second integrator 214 and the single-bit quantizer 216. The first feedback signal path is from the output signal port 250 to the third adder 212 via a first inverting gain unit 218. A signal output from the first inverting gain unit 218 to the third adder 212 is an n-bit signal. The second feedback signal path is from the output signal port 250 to the second adder 206 via a dither generator 230. The third feedback signal path is from the output signal port 250 to the first adder 204 via a second inverting gain unit 220. A signal output form the second inverting gain unit 220 to the first adder 204 is an n-bit signal. The fourth feedback signal path is from an output terminal of the first integrator 208 to the second adder 206 via the dither generator 230.

In addition, the first gain unit 202 has a first gain factor (not shown in FIG. 2). The second gain unit 210 has a second gain factor (not shown in FIG. 2). The first inverting gain unit 218 has a third gain factor (not shown in FIG. 2). The second inverting gain unit 220 has a forth gain factor (not shown in FIG. 2). The absolute values of the first gain factor, the second gain factor, the third gain factor and the fourth gain factor are smaller than 1.

The dither generator 230 comprises a second single-bit quantizer 236 and a logic circuit 234. The second quantizer 236 is coupled to the output terminal of the first integrator 208. A second random signal $S_{R2}$ is generated by the second single-bit quantizer 236. Then, the second random signal $S_{R2}$ is input to the random sequencer 234. A first random signal $S_{R1}$ is generated by the single-bit quantizer 216. Through the second feedback signal path, the first random signal $S_{R1}$ is input to the logic circuit 234. The logic circuit 234 is digitally implementing XOR logic. A third random signal $S_{R3}$ whose value is the product of the first random signal $S_{R1}$ and the second random signal $S_{R2}$ is output from the logic circuit 234. The value of the third random signal $S_{R3}$ is a 1-bit logic output. In the sigma-delta modulator employed to perform digital-to-analog conversion, the third random signal $S_{R3}$ is a dither signal $S_d$ and it will directly fed to the second adder 206.

While FIG. 2 shows the embodiment on a 2-order modulator, the invention is not limited thereby in scope, and can be applied to any order of modulator.

Figure 3:
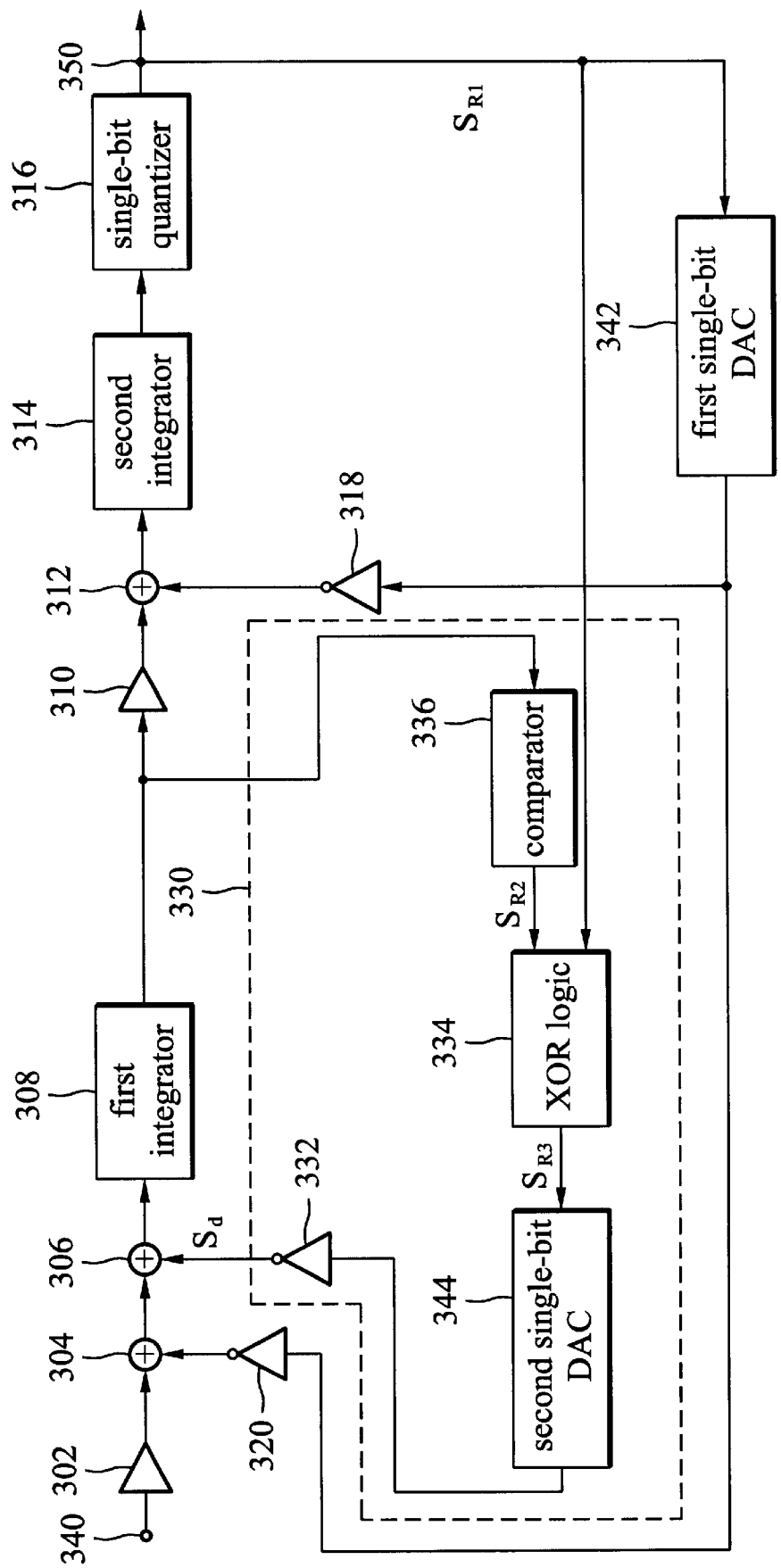
FIG. 3 is a schematic diagram illustrating a sigma-delta modulator according to the third embodiment of the invention.

FIG. 3 is a schematic diagram illustrating a sigma-delta modulator according to the third embodiment of the invention. The sigma-delta modulator is employed to perform analog-to-digital conversion. The sigma-delta modulator includes an input signal port 340 and an output signal port 350. The sigma-delta modulator in the embodiment is a modulator having two integrators 308 and 314 between the input signal port 340 and a single-bit quantizer 316 therein. The number of integrators in the modulator is generally referred to as the order of the modulator.

The sigma-delta modulator includes a feedforward signal path, a first feedback signal path, a second feedback signal path, a third feedback signal path and a forth feedback signal path. The feedforward signal path comprises a first gain unit 302, a first adder 304, a second adder 306, the first integrator 308, a second gain unit 310, a third adder 312, the second integrator 314 and the single-bit quantizer 316. The first feedback signal path is from the output signal port 350 to the third adder 312 via a first single bit digital-to-analog conversion (DAC) 342 and a first inverting gain unit 318. The second feedback signal path is from the output signal port 350 to the second adder 306 via a dither generator 330. The third feedback signal path is from the output signal port 350 to the first adder 304 via the first single bit DAC 342 and a second inverting gain unit 320. The fourth feedback signal path is from an output terminal of the first integrator 308 to the second adder 306 via the dither generator 330.

In addition, the first gain unit 302 has a first gain factor (not shown in FIG. 3). The second gain unit 310 has a second gain factor (not shown in FIG. 3). The first inverting gain unit 118 has a third gain factor (not shown in FIG. 3). The second inverting gain unit 320 has a forth gain factor (not shown in FIG. 3). The absolute values of the first gain factor, the second gain factor, the third gain factor and the fourth gain factor are smaller than 1.

The dither generator 330 comprises a comparator 336, a logic circuit 334, a third inverting gain unit 332 and a second single bit digital-to-analog conversion (DAC) 344. The second comparator 336 is coupled to the output terminal of the first integrator 308. A second random signal $S_{R2}$ is generated by the comparator 336. Then, the second random signal $S_{R2}$ is input to the random sequencer 334. A first random signal $S_{R1}$ is generated by the single-bit quantizer 316. Through the second feedback signal path, the first random signal $S_{R1}$ is input to the random sequencer 334. The logic circuit 334 is digitally implementing XOR logic. The logic circuit 334 receives the first random signal $S_{R1}$ and the second random signal $S_{R2}$ and produces a third random signal $S_{R3}$ to be output. The third random signal $S_{R3}$ is converted to an analog signal by the second single bit DAC 344. Then, the analog signal is attenuated by the third inverting gain unit 332 to produce a dither signal $S_d$. The dither signal $S_d$ is input to the second adder 306.

In addition, the third inverting gain unit 332 has a fifth gain factor (not shown in FIG. 3). The absolute value of the fifth gain factor is much smaller than the absolute values of the first gain factor, the second gain factor, the third gain factor and the fourth gain factor.

While FIG. 3 illustrates the embodiment on a 2-order modulator, the invention is not limited in scope in this, and can be applied to any order of modulator. Furthermore, the reference voltage can be any value that can properly attenuate the third random signal to become much smaller.

Figure 4A:
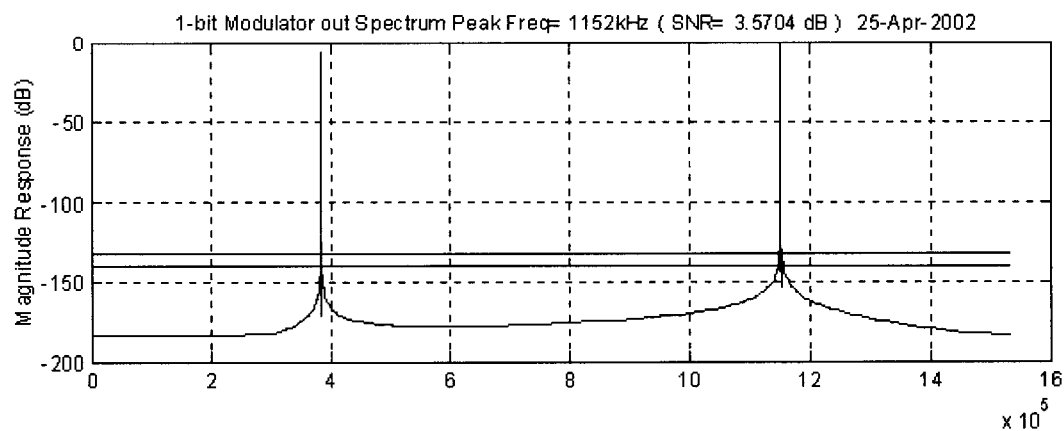
FIG. 4a and FIG. 4b show a spectrum of an output signal when inputting a DC signal whose value is 0 to a sigma-delta modulator without any dither signal.
Figure 4B:
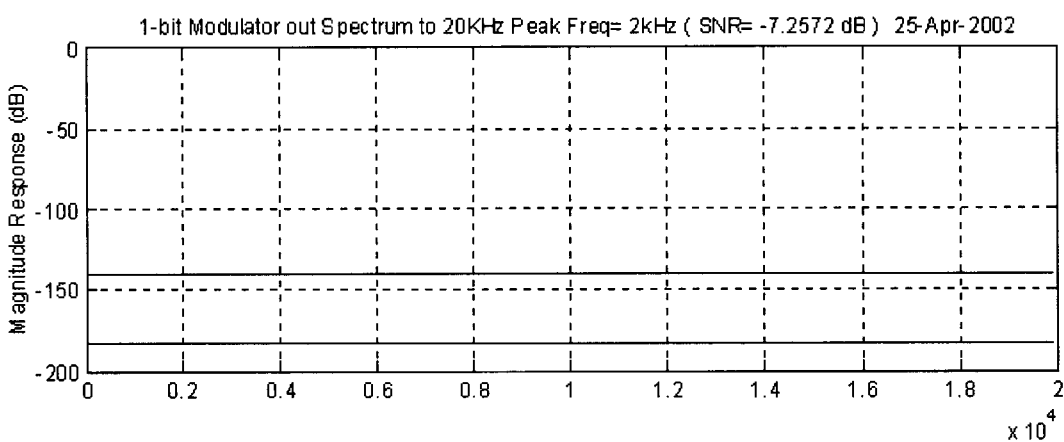
Figure 4C:
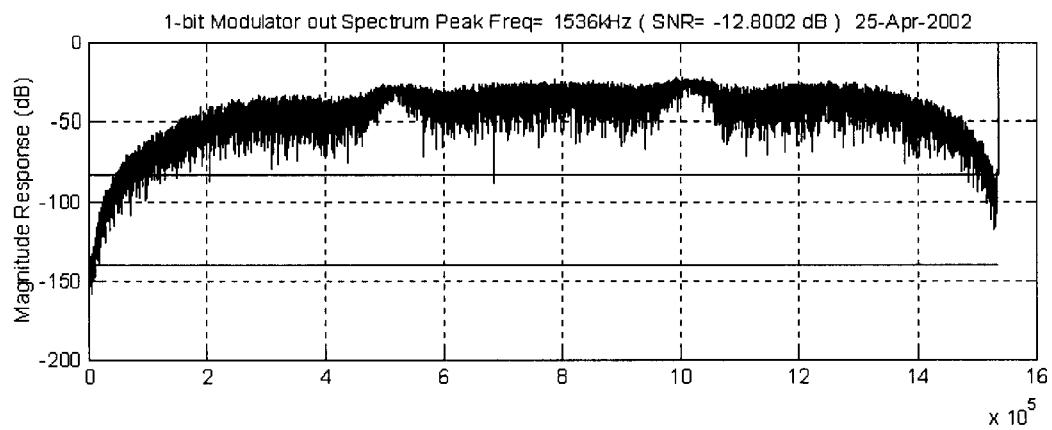
FIG. 4c and FIG. 4d show a spectrum of an output signal when inputting a DC signal whose value is 0 to a sigma-delta modulator according to the present invention.
Figure 4D:
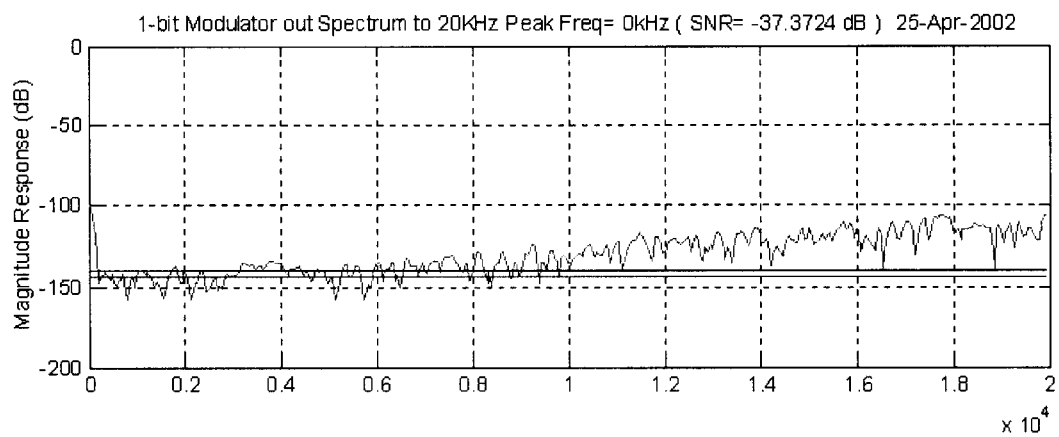

FIG. 4a and FIG. 4b show a spectrum of an output signal when inputting a DC signal whose value is 0 to a sigma-delta modulator without any dither signal. FIG. 4c and FIG. 4d show a spectrum of an output signal when inputting a DC signal whose value is 0 to a sigma-delta modulator according to the present invention. The X axis is the frequency, measured in hertz (Hz). The Y axis is the magnitude response, measured in decibels (dB). In FIG. 4a and FIG. 4c, the frequency is between 0 and 1600 kHz. In FIG. 4b and FIG. 4d, the frequency is between 0 and 20 kHz. As shown in FIG. 4a and 4b, a tone in frequency domain referred to as an idle channel tone is obvious. As shown in FIG. 4c and 4d, when using the sigma-delta modulator according to the present invention, the idle channel tone is removed.

Figure 5A:
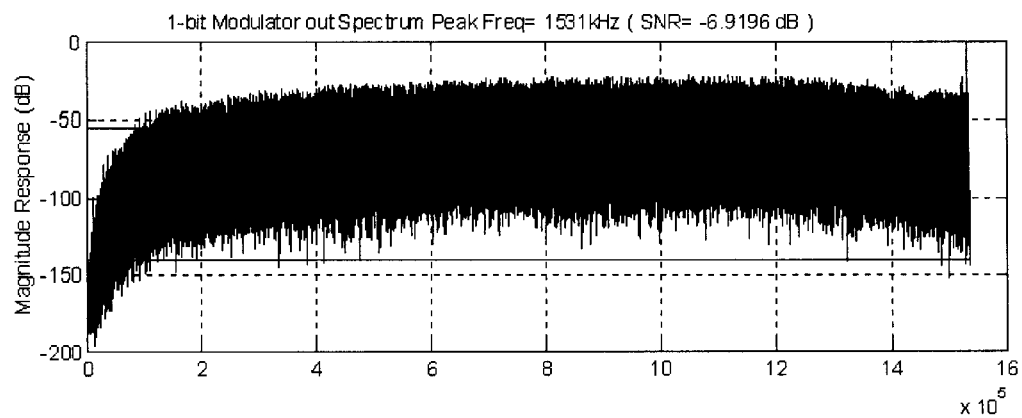
FIG. 5a and FIG. 5b show a spectrum of an output signal when inputting a DC signal whose value is 0.003 to a sigma-delta modulator without any dither signal.
Figure 5B:
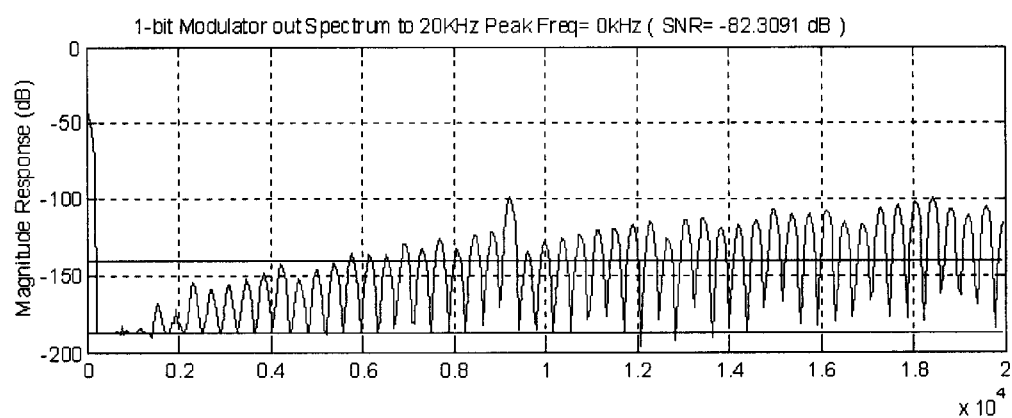
Figure 5C:
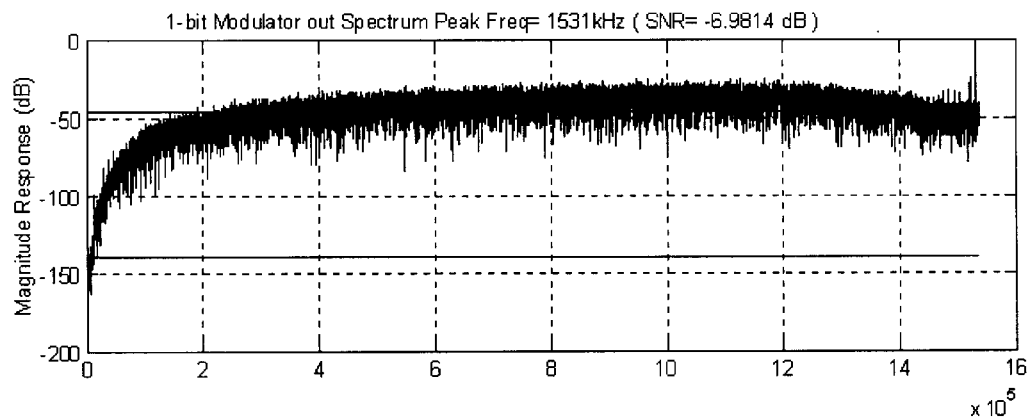
FIG. 5c and FIG. 5d show a spectrum of an output signal when inputting a DC signal whose value is 0.003 to a sigma-delta modulator according to the present invention.
Figure 5D:
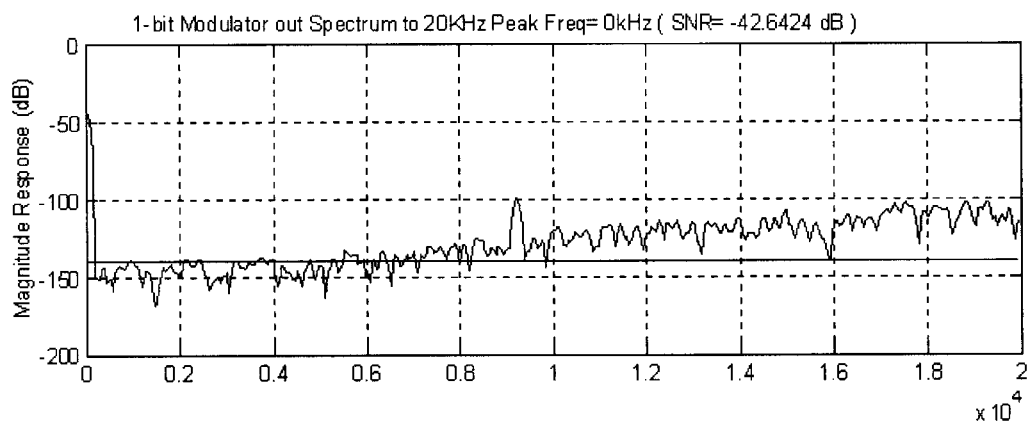

FIG. 5a and FIG. 5b show a spectrum of an output signal when inputting a DC signal whose value is 0.003 to a sigma-delta modulator without any dither signal. FIG. 5c and FIG. 5d show a spectrum of an output signal when inputting a DC signal whose value is 0.003 to a sigma-delta modulator according to the present invention. The X axis is the frequency, measured in hertz (Hz). The Y axis is the magnitude response, measured in decibels (dB). In FIG. 5a and FIG. 5c, the frequency is between 0 and 1600 kHz. In FIG. 5b and FIG. 5d, the frequency is between 0 and 20 kHz. As shown in FIG. 5a and 5b, a tone in frequency domain referred to as an idle channel tone is obvious. As shown in FIG. 5c and 5d, when using the sigma-delta modulator according to the present invention, the idle channel tone is removed.

Figure 6A:
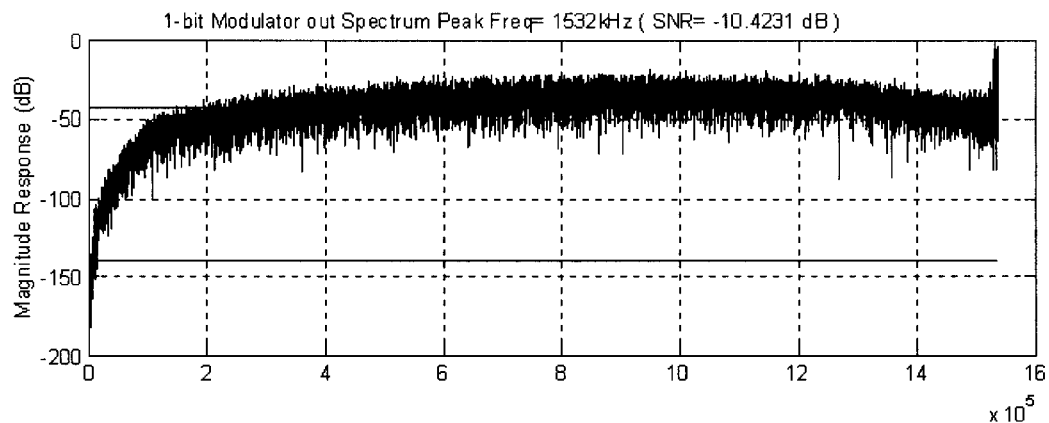
FIG. 6a and FIG. 6b show a spectrum of an output signal when inputting an AC signal whose value is 0.003 to a sigma-delta modulator without any dither signal.
Figure 6B:
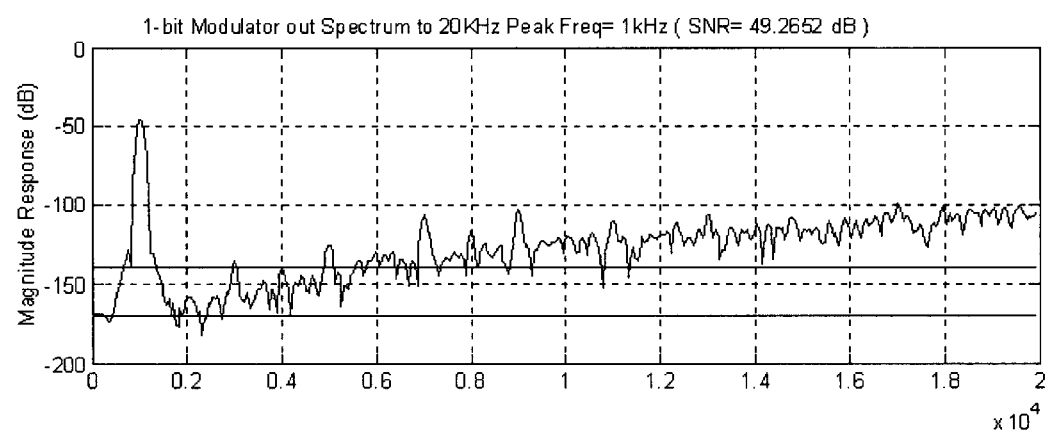
Figure 6C:
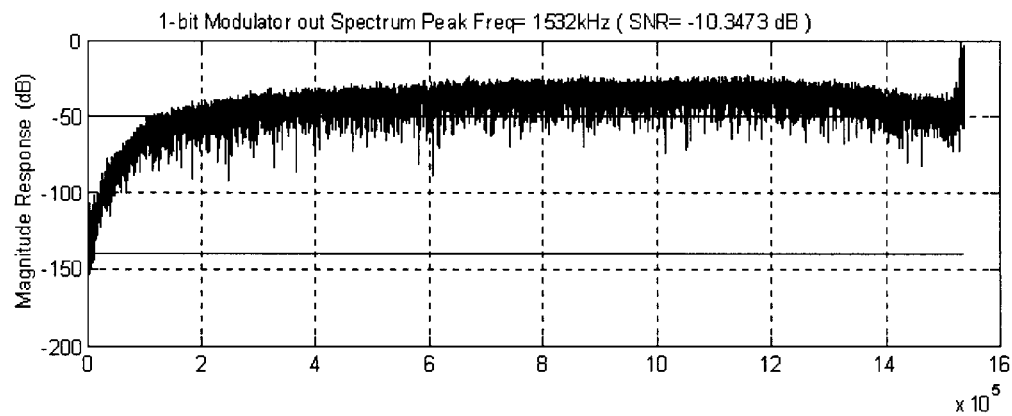
FIG. 6c and FIG. 6d show a spectrum of an output signal when inputting an AC signal whose value is 0.003 to a sigma-delta modulator according to the present invention.
Figure 6D:
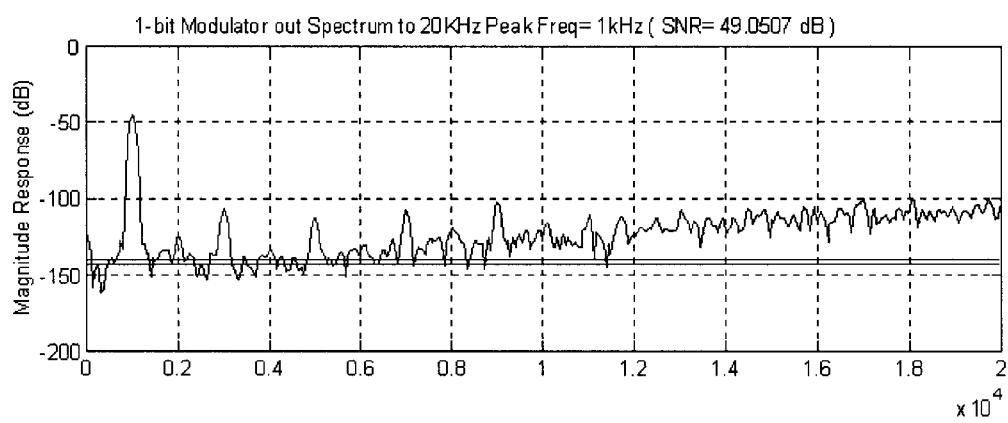

FIG. 6a and FIG. 6b show a spectrum of an output signal when inputting an AC signal whose value is 0.003 to a sigma-delta modulator without any dither signal. FIG. 6c and FIG. 6d show a spectrum of an output signal when inputting an AC signal whose value is 0.003 to a sigma-delta modulator according to the present invention. The X axis is the frequency, measured in hertz (Hz). The Y axis is the magnitude response, measured in decibels (dB). In FIG. 6a and FIG. 6c, the frequency is between 0 and 1600 kHz. In FIG. 6b and FIG. 6d, the frequency is between 0 and 20 kHz. As shown in FIG. 6b, the average value of the signal to noise ratio (SNR) is 49.27 dB. As shown in FIG. 6d, when using the sigma-delta modulator according to the present invention, the average value of the signal to noise ratio (SNR) is 49.05 dB. The signal to noise ratio of the sigma-delta modulator according to the present invention is almost the same that of the sigma-delta modulator without any dither signal. Thus, the sigma-delta modulator in the present invention does not reduce the SNR.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Thus, the scope of the appended claims should be accorded the broadest interpretation so as to encompass all such modifications and similar arrangements.

What is claimed is:

1. A sigma-delta modulator, comprising:

an integrator having an input terminal and an output terminal;

a first quantizer for generating a first random signal, an input terminal thereof coupled to the output terminal of the integrator;

a dither generator, an input terminal thereof coupled to the output terminal of the integrator, the dither generator comprising:
- a second quantizer for generating a second random signal, an input terminal thereof coupled to the output of the integrator;
- a random sequencer for receiving the first random signal and the second random signal and producing a third random signal to be output; and
- an attenuator for attenuating the third random signal to produce and output a dither signal; and means for adding the dither signal to the input terminal of the integrator.

2. The sigma-delta modulator as claimed in claim 1, wherein the second quantizer is a single-bit quantizer.

3. The sigma-delta modulator as claimed in claim 1, wherein the second quantizer is a comparator.

4. The sigma-delta modulator as claimed in claim 1, wherein the random sequencer is a logic circuit digitally implementing XOR logic.

5. The sigma-delta modulator as claimed in claim 1, wherein the means for adding the dither signal to the input terminal of the integrator is an adder.

6. A sigma-delta modulator, comprising:

an integrator having an input terminal and an output terminal;

a first single-bit quantizer for generating a first random signal, an input terminal thereof coupled to the output terminal of the integrator;

a dither generator, an input terminal thereof coupled to the output terminal of the integrator, the dither generator comprising:
- a second single-bit quantizer for generating a second random signal, an input terminal thereof coupled to the output of the integrator; and
- a random sequencer for receiving the first random signal and the second random signal and producing a dither signal to be output; and means for adding the dither signal to the input terminal of the integrator.

7. The sigma-delta modulator as claimed in claim 6, wherein the random sequencer is a logic circuit digitally implementing XOR logic.

8. The sigma-delta modulator as claimed in claim 6, wherein the means for adding the dither signal to the input terminal of the integrator is an adder.

9. A sigma-delta modulator, comprising:

an integrator having an input terminal and an output terminal;

a single-bit quantizer for generating a first random signal, an input terminal thereof coupled to the output terminal of the integrator;

a dither generator, an input terminal thereof coupled to the output terminal of the integrator, the dither generator comprising:
- a comparator for generating a second random signal, an input terminal thereof coupled to the output of the integrator;
- a random sequencer for receiving the first random signal and the second random signal and producing a third random signal to be output;
- a single-bit digital-to-analog converter for converting the third random signal into an analog signal; and
- an attenuator for attenuating the analog signal to produce and output a dither signal; and means for adding the dither signal to the input terminal of the integrator.

10. The sigma-delta modulator as claimed in claim 9, wherein the random sequencer is a logic circuit digitally implementing XOR logic.

11. The sigma-delta modulator as claimed in claim 9, wherein the means for adding the dither signal to the input terminal of the integrator is an adder.

12. The sigma-delta modulator as claimed in claim 9, wherein the attenuator is a gain unit with a very small gain factor.

\* \* \* \* \*